United States Patent
Todokoro et al.

[11] 4,041,316
[45] Aug. 9, 1977

[54] FIELD EMISSION ELECTRON GUN WITH AN EVAPORATION SOURCE

[75] Inventors: Hideo Todokoro; Tsutomu Komoda, both of Tokyo, Japan

[73] Assignee: Hitachi, Ltd., Japan

[21] Appl. No.: 614,311

[22] Filed: Sept. 17, 1975

[30] Foreign Application Priority Data

| Sept. 20, 1974 | Japan | 49-107819 |
| Aug. 13, 1975 | Japan | 50-97656 |
| Aug. 13, 1975 | Japan | 50-97657 |
| Aug. 13, 1975 | Japan | 50-97658 |

[51] Int. Cl.² ............................................. H01J 29/48
[52] U.S. Cl. ................. 250/396 R; 250/310; 250/311
[58] Field of Search ............. 250/306, 310, 311, 396, 250/424

[56] References Cited

U.S. PATENT DOCUMENTS

| 3,327,112 | 6/1967 | Akaltori | 250/311 |
| 3,678,333 | 7/1972 | Coates et al. | 250/311 |
| 3,766,427 | 10/1973 | Coates et al. | 250/311 |
| 3,927,321 | 12/1975 | Welter | 250/311 |
| 3,931,519 | 1/1976 | Coates et al. | 250/311 |

*Primary Examiner*—Davis L. Willis
*Assistant Examiner*—B. C. Anderson
*Attorney, Agent, or Firm*—Craig & Antonelli

[57] ABSTRACT

A field emission electron gun provided in a housing defining a vacuum chamber comprises a field emission tip as an electron source, an anode spaced from and facing the field emission tip, the field emission tip and the anode defining a space in which the field emission tip produces electrons. An evaporation source disposed in the vacuum chamber, the evaporating material from which forms evaporation layers on the inner surface of the vacuum chamber and the anode surface. A first voltage source is interconnected between the field emission tip and the anode, in order to accelerate the electrons from the tip toward the anode, and a second voltage source is connected with the evaporation source to supply a current for the evaporation. The evaporation layers are formed before the first voltage source is actuated, whereby reactive gases adhering to and embedded to the inner surface of the vacuum chamber and the anode are suppressed from being drawn out by electron bombardment.

3 Claims, 4 Drawing Figures

FIELD EMISSION ELECTRON GUN WITH AN EVAPORATION SOURCE

BACKGROUND OF THE INVENTION

The present invention relates to a field emission electron gun and, more particularly, to a field emission electron gun with an evaporation source for an electron microscope.

An electron microscope comprises a field emission electron gun which includes a field emission tip as an electron source, an anode spaced from and facing the field emission tip, and a vacuum chamber. A voltage applied between the tip and the anode draws out electrons from the tip and accelerates the electrons. The applied voltage is on the order of 3 to 5KV. Generally, the anode is at ground potential and a negative high voltage is applied to the field emission tip. The field emission tip is disposed within the vacuum chamber at an ultra high vacuum on the order of $1 \times 10^{-9}$ Torr in order that it will operate with stability and for a long period of time. The field emission tip is an etched tip which does not employ any filament to emit electrons, the diameter of which is very small, such as 2000 Å or smaller. The field emission tip is made of a material such as a tungsten, etc., from which electrons are easily produced.

This type of field emission electron gun has an advantage in that an electron beam of high electron density is obtained therefrom. Instability, however, arises from excessive gas molecules in the vacuum chamber and the anode surface, to which the gas molecules adhere and are embedded when the electrons from the field emission tip bombard the surfaces thereof during opearation of the electron microscope. As a result, the operation of the electron microscope cannot be stably maintained for a long period of time. The larger the beam current from the field emission electron gun, the more conspicuous is this phenomenon. In a scanning type electron microscope, for example, wherein all beam currents emitted from the field emission tip are large (10 to 20 $\mu$A), the period of stability is very short (several minutes). Although there are techniques, such as baking, to reduce the gases drawn out of the surfaces of the vacuum chamber and the anode by electron bombardment, a long period of time is required to evacuate the gases from the surfaces thereof and, as a result, such techniques are not practical.

SUMMARY OF THE INVENTION

An object of the invention is to provide a field emission electron gun having improved tip current stability.

Another object of the invention is to provide a field emission electron gun with means for reducing gases drawn from the inner surfaces of the vacuum chamber and the anode surface, etc.

A further object of the invention is to provide a field emission electron gun with an evaporation source.

An additional object of the invention is to provide a field emission electron gun with an evaporation source which can be utilized repeatedly.

In order to achieve those objects, the field emission electron gun comprises a field emission tip as an electron source, an anode spaced from and facing the field emission tip, the field emission tip and the anode defining a space in which the field emission tip produces electrons, and an evaporation source disposed in the neighborhood of the field emission tip, the evaporating material from which forms evaporation layers on surfaces of the portions such as the inner surfaces of the vacuum chamber and the anode surface, which the primary electrons from the field emission tip bombard and the secondary electrons therefrom further bombard. The evaporation layers, which are formed on the surface at an ultra high vacuum, before an operating voltage is applied between the field emission tip and the anode, serve as layers for suppressing gases which are drawn from the surfaces by the electron bombardment, whereby the field emission electron gun can emit an electron beam with stability and for a long period of time.

These and other objects of this invention will be understood in more detail referring to the description in connection with the drawings.

DETAILED DESCRIPTION

Figure 1:
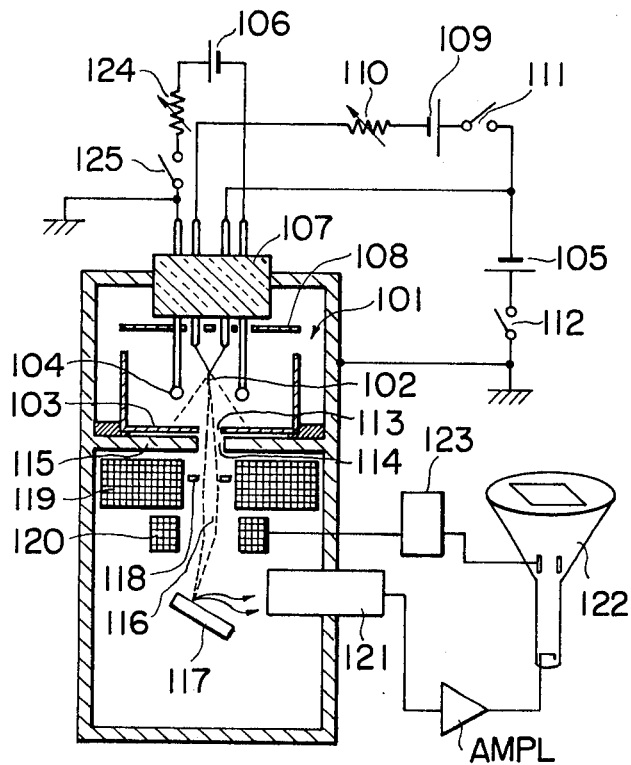
FIG. 1 is a schematic diagram of a scanning type electron microscope employing the field emission electron gun according to the invention.

Referring now to FIG. 1, there is shown a scanning type electron microscope which includes a field emission electron gun, an electron lens system and detecting means with displaying means. The field emission electron gun comprises a vacuum chamber 101, a field emission tip 102 as an electron source disposed therein, an anode 103 spaced from the field emission tip 102, the field emission tip 102 and the anode 103 defining a space in which electrons are produced, an evaporation source 104 disposed in the neighborhood of the field emission tip 102, a first voltage source 105 interconnected between the tip 102 and the anode 103 in order to accelerate the electrons from the tip 102 toward the anode 103, and a second voltage source 106 connected with the evaporation source 104 to supply the current for evaporation. The field emission electron gun further includes an insulating portion 107, a shield plate 108 and a third voltage source 109. The insulating portion 107 supports the field emission tip 102 and the evaporation source 104, etc., in the vacuum chamber 101 and separates them electrically from the vacuum chamber 101. The shield plate 108 is so arranged as to prevent the evaporating material from the evaporation source 104 from being deposited on the surface of the insulating portion 107. A circuit comprising the third voltage source 109, a resistor 110, and a switch 111 is actuated and heats the field emission tip 102 before a circuit comprising the first voltage source 105 and a switch 112 is actuated to operate the electron microscope, so that reactive gases adhering to and embedded in the tip 102 are evacuated therefrom.

The field emission electron gun produces electrons, part of which pass through apertures 113 and 114 formed through the anode 103 and a separation plate 115, which is disposed between the electron gun and the electon lens system, and form an electron beam 116 illuminating a specimen 117. The electron beam 116 having passed through the apertures 113 and 114 is focused by an iris 118 and an objective lens 119, and then is deflected by means of a deflection coil 120 in order to scan the specimen 117. Informations about the specimen 117 is obtained by detecting transmitted electrons, secondary electrons, reflected electrons, absorbed electrons, photons or X-rays, any or all of which are generated by the electron beam from the electron gun. A detector 121 is used to detect one of these signals, which is then used to modulate the intensity of a synchronously scanned display tube 122 with a sweep generator 123 to form an image of the specimen 117.

Now, the principle of the invention will be explained in more detail. The elements which constitute the field emission electron gun, generally, are formed in an air atmosphere; in addition, the electron gun is assembled therein. As a consequence, reactive gases adhere to and are embedded in the elements of the electron gun. When such an electron gun employing a field emission tip operates upon the application of an operating voltage between the field emission tip and the anode at an ultra high vacuum on the order of $1 \times 10^{-8}$ to $1 \times 10^{-9}$ Torr, the primary electrons emitted from the field emission tip strike the inner surfaces of the vacuum chamber and the anode surface, etc.; furthermore, the secondary electrons generated by the bombardment of the primary electrons hit the surfaces thereof, so that the reactive gases adhering to and embedded in the surfaces thereof are drawn out within the vacuum chamber and the degree of vacuum decreases. Consequently, a constant current from the electron gun is not obtained since the reactive gases adhere to the field emission tip. This is one of the reasons why the electron gun employing the field emission tip cannot provide a stable operation over a long period of time. According to the present invention, in the vacuum chamber, in which the field emission electron gun is disposed, an evaporation source is provided, and the chamber is evacuated by a vacuum pump and is maintained at an ultra high vacuum on the order of $1 \times 10^{-8}$ to $1 \times 10^{-9}$ Torr, before the evaporating material from the evaporation source is vaporized. Then, a circuit comprising a second voltage source 106, a resistor 124 and a switch 125 is actuated in order to vaporize the evaporating material, which forms evaporation layers on the surfaces of the portions which the primary and the secondary electrons strike. After that, the circuit including the second voltage source 106 provides ground potential and the circuit including the first voltage source 105 is actuated in order to operate the electron microscope. Thus, the vacuum pump continues to operate during this period to evacuate gases from the vacuum chamber. In such a case where the evaporation layers are formed at an ultra high vacuum, the evaporation layers coating the surfaces of the portions prevent the reactive gases from being drawn out from the surfaces thereof. Although primary and secondary electrons bombard the evaporation layers, reactive gases are not generated, since they do not include reactive gases as described above and are very pure. As the evaporating material, there are materials capable of being vaporized, such as gold, aluminum, carbon, silver, titanium, molybdenum, potassium, palladium, rhenium, manganese, tantalum, nickel, chromium, iron, ruthenium, tungsten, boride, copper, platinum, semiconductor material, such as a silicon and a germanium, and a compound including one or more thereof, in addition to an alloy such as a stainless steel.

The thickness of the evaporation layers depends upon the energy of the electrons to be accelerated and the types of the evaporating materials, and is selected so that the accelerated electrons do not reach the surfaces of the portion after having passed through the evaporation layers. Where the evaporating materials are gold, nickel, or stainless steel, for example, the thickness of the evaporation layer is about 3000 A or more.

Furthermore, it is preferred that the evaporation layers be formed even though a time-consuming process is required. In other words, the evaporation source discharges the reactive gases included therein at the start of the evaporation processes, so that the evaporation layers formed at that time include the reactive gases and are not pure. The evaporation layers, however, which are formed after the reactive gases discharged from the evaporation source have been evacuated by the vacuum pump, do not include the reactive gases and are pure. In such a case, nickel, chromium, iron, stainless steel, ruthenium, titanium, manganese, molybdenum, palladium, rhenium, and tungsten, for example, are utilized as the evaporating material, which keeps evaporating over a long period of time, such as a period of thirty minutes or more, and the evaporation temperature thereof is lower than the melting temperature thereof.

Where magnetic material such as nickel and iron is used as the evaporating material, astigmatism of the electron beam arises when the evaporation layers made of magnetic material are nonuniform. In order to prevent this problem, a non-magnetic material such as stainless steel, gold, aluminum, copper, molybdenum, ruthenium, palladium, silver, rhenium, platinum, tungsten, titanium, tantalume, germanium, and silicon, etc., may be utilized.

The structure of the field emission electron gun of the invention will be explained in more detail in connection with FIG. 2. The vacuum chamber 101 comprises a wall portion 201, an upper portion 202, and a lower portion 203 which are assembled air-tight to each other with use of packings 204 and 205. The vacuum chamber 101 continues to be evacuated through an evacuation pipe 206 by a vacuum pump (not indicated), which may be an ion pump. The insulating portion 107 has electrodes 207 and 208, each of which is connected with the field emission tip 102 and the evaporation source 104 by joints 210, respectively, for support. In addition, the insulating portion 107 is air-tight with the upper portion 202 and electrically separates the electrodes 207 and 208 from the upper portion 202. The anode 103 is fixed at the lower portion 203 by screws 209, the potential of which is equal to that of the walls of the vacuum chamber 101 (generally, ground potential). The anode 103, which may be plate shaped, has an aperture 113, through which the electron beam from the electron gun passes. The shield plate 108 is fixed to one of the electrodes 208 by a joint 211. The other of the electrodes 208 should not be connected with the shield plate 108 in order to apply the current for evaporation thereto.

Figure 3:
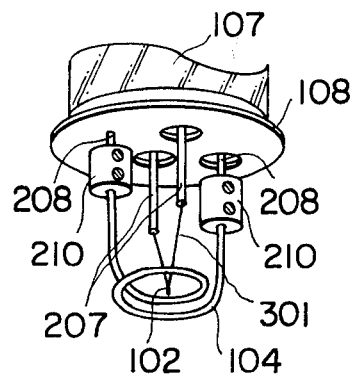
FIG. 3 is a partially enlarged view of the field emission electron gun of the invention.
Figure 2:
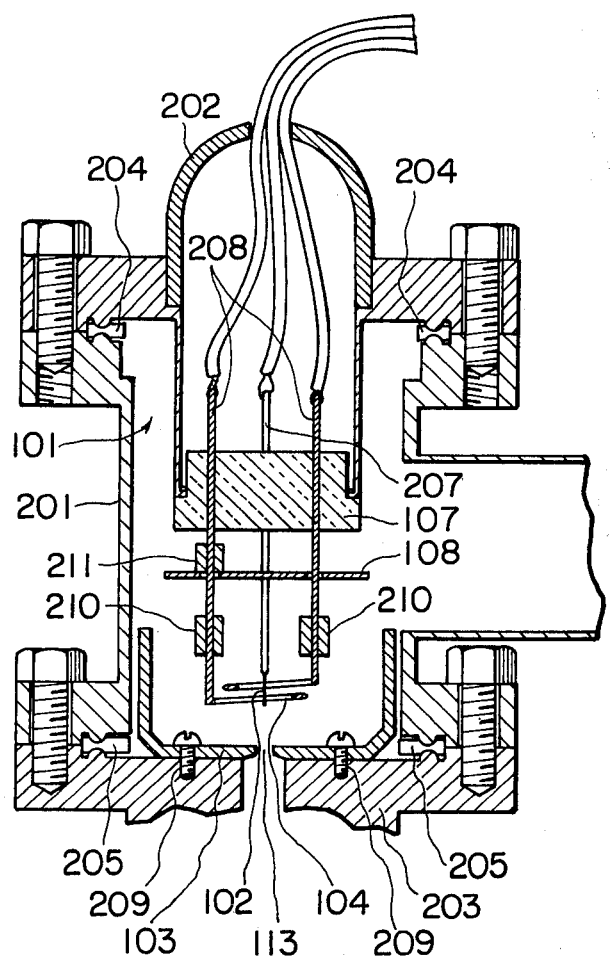
FIG. 2 is a vertical sectional view of the field emission electron gun of the invention.

FIG. 3 shows a partially enlarged view of the field emission electron gun of the invention, in which reference numerals correspond to those of FIG. 2 and a reference numeral 301 designates a filament, by which the field emission tip 102 is supported. The filament 301, both ends of which are connected with the electrodes 207, respectively, heats the field emission tip 102 when the flashing circuit including the third voltage source 109 is actuated, and serves as means for applying the voltage for the operation of the electron microscope. The evaporation source 104 comprises a wire made of the evaporating material such as nickel and stainless steel, etc. The wire as the evaporation source 104 is formed with a loop shape or a coil shape in order to uniformly form the evaporation layers, both ends of which are connected with the electrodes 208, respectively, to apply the current for evaporation. The center of the loop or the coil should be placed on the axis of the tip 102. The wire may be a stranded wire comprising two or more evaporating materials. The wire as the evaporation source 104 in this embodiment uses stainless steel of 0.8 mm$\phi$, to which a current of 9 A for the evaporation is applied for thirty minutes, so that uniform evaporation layers of about 3000 A in a thickness are obtained. The shape of the wire, however, may be a half loop, if the astigmatism of the electron beam according to a non-uniform evaporation layer is small. Although the wire itself is utilized as the evaporation source in the above embodiment, the evaporation source utilized in this invention is not limited thereto. Thus, it is possible to use a conventional evaporation source such as a basket in which the evaporation material is disposed.

Figure 4:
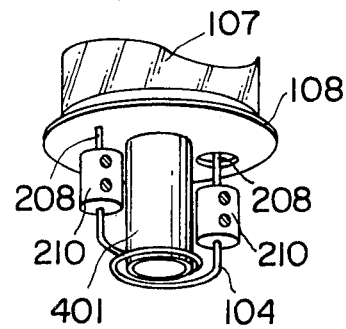
FIG. 4 is a partially enlarged view of the field emission electron gun in a modified embodiment of the invention.

FIG. 4 illustrates a modified electron gun according to the invention, in which reference numerals correspond to those in FIG. 2 and a reference numeral 401 designates a cylindrical shaped shield portion, which is fixed at the shield plate 108 and is disposed around the field emission tip 102, in order to prevent the evaporation material from adhering to the surface of the field emission tip 102. The shield portion 401 is used for the following reason. When nickel, molybdenum, ruthenium, tantalum, tungsten, rhenium, and a boride, etc., are utilized as the evaporation material, they react with the field emission tip 102 due to their adherence thereto, so that the field emission tip 102 deteriorates. In order to eliminate such a problem, the shield portion 401 is used. Furthermore, when the shield portion is made of a magnetic shield material, the astigmatism of the electron beam is suppressed. When an evaporation material which does not react with the tip 102 is used, the shield portion 401 need not be used because the evaporation material which adheres to the tip is removed by the flashing of the tip.

While only a few forms of the present invention have been shown and described, many modifications will be apparent to those skilled in the art within the spirit and scope of the invention as set forth in the appended claims.

What is claimed is:

1. A method of starting a field emission electron gun having a vacuum chamber, a field emission tip disposed in said vacuum chamber, an anode spaced apart from said field emission tip and defining a space therebetween in which said field emission tip emits electrons, and vacuum pump means for evacuating said vacuum chamber, the method serving to prevent electrons emitted from said field emission tip from causing deteriorating gas molecules from being drawn out of the surfaces within said vacuum chamber comprising the steps of:
   a. operating said vacuum pump means to evacuate said vacuum chamber to a predetermined degree of vacuum;
   b. vaporizing a material for a predetermined time adjacent said field emission tip while said vacuum pump means is still operating to form protective evaporation layers on those surfaces within said vacuum chamber from which said deteriorating gas molecules would otherwise be drawn out by said emitted electrons; and
   c. after vaporizing said material for said predetermined time, connecting a voltage source means to said field emission tip to cause electrons to be emitted therefrom.

2. A method as defined in claim 1, wherein said vaporized material is selected from the group consisting of nickel, chromium, iron, stainless steel, ruthenium, manganese, molybdenum, palladium, rhenium, tungsten, titanium, and compounds thereof.

3. A method as defined in claim 1, wherein said vaporized material is a non-magnetic material.

* * * * *